United States Patent [19]
Khu

[11] Patent Number: 5,805,607
[45] Date of Patent: Sep. 8, 1998

[54] METHOD FOR USER-CONTROLLED I/O SWITCHING DURING IN-CIRCUIT PROGRAMMING OF CPLDS THROUGH THE IEEE 1149.1 TEST ACCESS PORT

[75] Inventor: Arthur H. Khu, San Mateo, Calif.

[73] Assignee: Advanced Micro Devices, Inc., Sunnyvale, Calif.

[21] Appl. No.: 734,888

[22] Filed: Oct. 22, 1996

[51] Int. Cl.$^6$ .................................................. G01R 31/28
[52] U.S. Cl. .......................................... 371/22.31; 326/39
[58] Field of Search .................................. 371/22.3, 22.2, 371/22.5, 22.1, 22.31, 22.32, 22.6; 395/183.06, 183.19; 326/37–39; 364/765, 580; 365/201

[56] References Cited

U.S. PATENT DOCUMENTS

| | | | |
|---|---|---|---|
| 5,231,314 | 7/1993 | Andrews | 307/480 |
| 5,347,519 | 9/1994 | Cooke et al. | 371/22.3 |
| 5,355,369 | 10/1994 | Greenbergerl et al. | 371/22.3 |
| 5,412,260 | 5/1995 | Tsui et al. | 326/39 |
| 5,426,738 | 6/1995 | Hsieh et al. | 395/275 |
| 5,428,624 | 6/1995 | Blair et al. | 371/22.3 |
| 5,448,525 | 9/1995 | Struges | 365/201 |

*Primary Examiner*—Robert W. Beausoliel, Jr.
*Assistant Examiner*—Nadeem Iqbal
*Attorney, Agent, or Firm*—Davis Chin

[57] ABSTRACT

A programmable logic device operable to generate different control signals during a time interval when it is being reconfigured includes a plurality of I/O pins (18a–18f), boundary scan circuitry (14) operatively connected to the I/O pins for loading a new set of data and for driving the new set of data onto the I/O pins, and means for programming (33) the programmable logic device on a row-by-row basis when loaded with program instructions. Control circuitry (31a) is provided to control the programming means to be operated on a self-timed interval for programming each row so that the boundary scan circuitry can be loaded with additional sets of data to generate the different control signals. The control circuitry includes a programming timer register (70) and a programming status register (68).

7 Claims, 4 Drawing Sheets

PROG_LINE=(PROGRAM INSTRUCTION)*(RUN_TEST_IDLE STATE)*(PROG_LINE)
+(PROG_OPER)*(TIMER I=0)*(STATUS I=DONE)

METHOD FOR USER-CONTROLLED I/O SWITCHING DURING IN-CIRCUIT PROGRAMMING OF CPLDS THROUGH THE IEEE 1149.1 TEST ACCESS PORT

BACKGROUND OF THE INVENTION

This invention relates generally to programmable logic arrays or devices and more particularly, it relates to a circuit and method of controlling the state of the input/output (I/O) pins in an in-circuit or in-system complex programmable logic device during programming by using the IEEE 1149.1 test access port (TAP).

As is generally known in the art, arrays for performing logic functions, typically called logic arrays or programmable logic arrays, has been used in recent years to replace random logic in many complex digital circuits. Such programmable logic arrays are especially useful in the control section of microcomputer systems and controllers and are frequently thought of as read-only storage, read-only memories or the like. The programmable logic array is a well-known convenient way of using arrays of identical circuit elements to implement arbitrary logical functions in semiconductor integrated circuits.

Such programmable logic arrays (PLA) typically have a two "plane" structure, i.e., two separate regions or groupings of logic gates with the outputs from one region leading into the other. For instance, a typical PLA comprises a first array which generates a product of sum terms and is referred to as the "AND" array or plane, and a second array which generates sum of product terms and is referred to as the "OR" array or plane. This type of two-plane PLA allows a large number of arbitrary logic equations to be implemented in an orderly manner. The orderly structure of PLAs is particularly advantageous in designing large scale integrated (LSI) or very large scale integrated (VLSI) systems.

As the programmable logic arrays formed on integrated circuit semiconductor devices become more and more complex and sophisticated referred to as "complex programmable logic devices" (CPLDs), there has been developed the addition of circuitry built directly into the CPLD so as to permit entry into a programming mode on receipt of appropriate sequence of signals. It is preferable that the programming or reconfiguration of the CPLD be performed while it is still connected to system components on a printed circuit board. In order to avoid interference with the normal operation of the system components during such programming operation, the input/output pins of the CPLD were only tri-stated (i.e., high impedance) during its programming in the prior art method. However, some of the input/output pins may be required to be placed at a HIGH level or LOW level and not just tri-stated in order to prevent short-circuits or bus contention. Accordingly, it would be desirable to be able to allow a user to control the switching of the I/O pins to be either set HIGH, LOW, or TRI-STATE during programming of the CPLD.

In designing circuitry that may be built directly into an integrated circuit to assist in test, maintenance and support of assembled printed circuit boards, the electronic industry has standards, promulgated by various professional organizations, that must be followed. In particular, the IEEE Standards Board approved on Feb. 15, 1990, IEEE Std. 1149.1 and approved on Jun. 17, 1993, IEEE Std. 1149.1a which is entitled "Test Access Port and Boundary-Scan Architecture." This IEEE publication is hereby incorporated by reference in its entirety. The standards set forth in the IEEE publication define test logic that can be included in an integrated circuit to standardize approaches to: (1) testing the interconnection between integrated circuits after they have been assembled onto a printed circuit board or other substrate, (2) testing the integrated circuit itself, and (3) modifying circuit activity during component's normal operation. The test logic consists of a boundary-scan register and other building blocks which are accessed through a Test Access Port (TAP). The boundary-scan architecture as required by the IEEE Std. includes the boundary-scan register which is formed of a number of boundary-scan cells each located adjacent to corresponding pins of an integrated circuit so that signals at the integrated circuit boundaries can be controlled and observed using scan testing principles.

As is already known in the art, there exists programmable logic devices (e.g., MACH JTAG CPLDs manufactured by AMD, Inc.) with JTAG boundary scan circuitry controlling the I/O pins thereof. In this prior art, the CPLD is formed with JTAG circuitry connected in it. The JTAG circuitry includes boundary scan registers and TAP circuitry. Prior to programming, the I/O pins of the CPLD must be set to one of the known states. Since programming is performed on a row-by-row basis, the data in the boundary scan cells can be changed only after the programming time (e.g., 50 ms). As a result, the state of the I/O pins can only be changed after at least 50 ms have elapsed.

It would therefore be desirable to increase the rate at which the data can be changed on the I/O pins while reconfiguring the CPLD. The present invention provides control circuitry which can be added to the existing TAP circuitry so as to make row programming a self-timed operation thereby increasing the switching rate on the I/O pins.

SUMMARY OF THE INVENTION

Accordingly, it is a general object of the present invention to provide a method for controlling the state of I/O pins in a complex programmable logic device during programming which overcomes the disadvantages of the prior art.

It is an object of the present invention to provide control circuitry for a CPLD so as to permit row programming on a self-timed basis.

It is another object of the present invention to provide a programmable logic device operable to generate different control signals during a time interval when it is being reconfigured.

It is still another object of the present invention to provide a programmable logic device operable to generate different control signals which includes control circuitry formed of a programming timer register and a programming status register.

In accordance with these aims and objectives, the present invention is concerned with the provision of a programmable logic device operable to generate different control signals during a time interval when it is being programmed. The programmable logic device includes a plurality of I/O pins and boundary scan circuitry operatively connected to the I/O pins for loading a new set of data and for driving the new set of data onto the I/O pins. There is provided a means for programming the programmable logic device on a row-by-row basis when it is loaded with the program instructions.

A timer circuit is provided for counting a predetermined amount of programming time and is started in response to the loading of the program instruction into the programming means. An indicator circuit is set prior to the loading of the program instruction into the programming means and generates a status signal when the timer circuit has completed counting the predetermined amount of programming time. The programming means is responsive to the status signal for halting the programming of a particular row.

The boundary scan circuitry is capable of being loaded with additional sets of data to generate the different control signals during the time interval between the start of programming of the particular row and before the loading of programming data for the next row. The loading of the boundary scan circuitry with the additional sets of data is temporarily suspended until after the program instructions, programming data and programming time count have been loaded and the programming means has been started again. When the status signal has been generated and the programming has been halted, the user can still load different sets of data to generate different control signals to the I/O pins.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENTS

Figure 1:
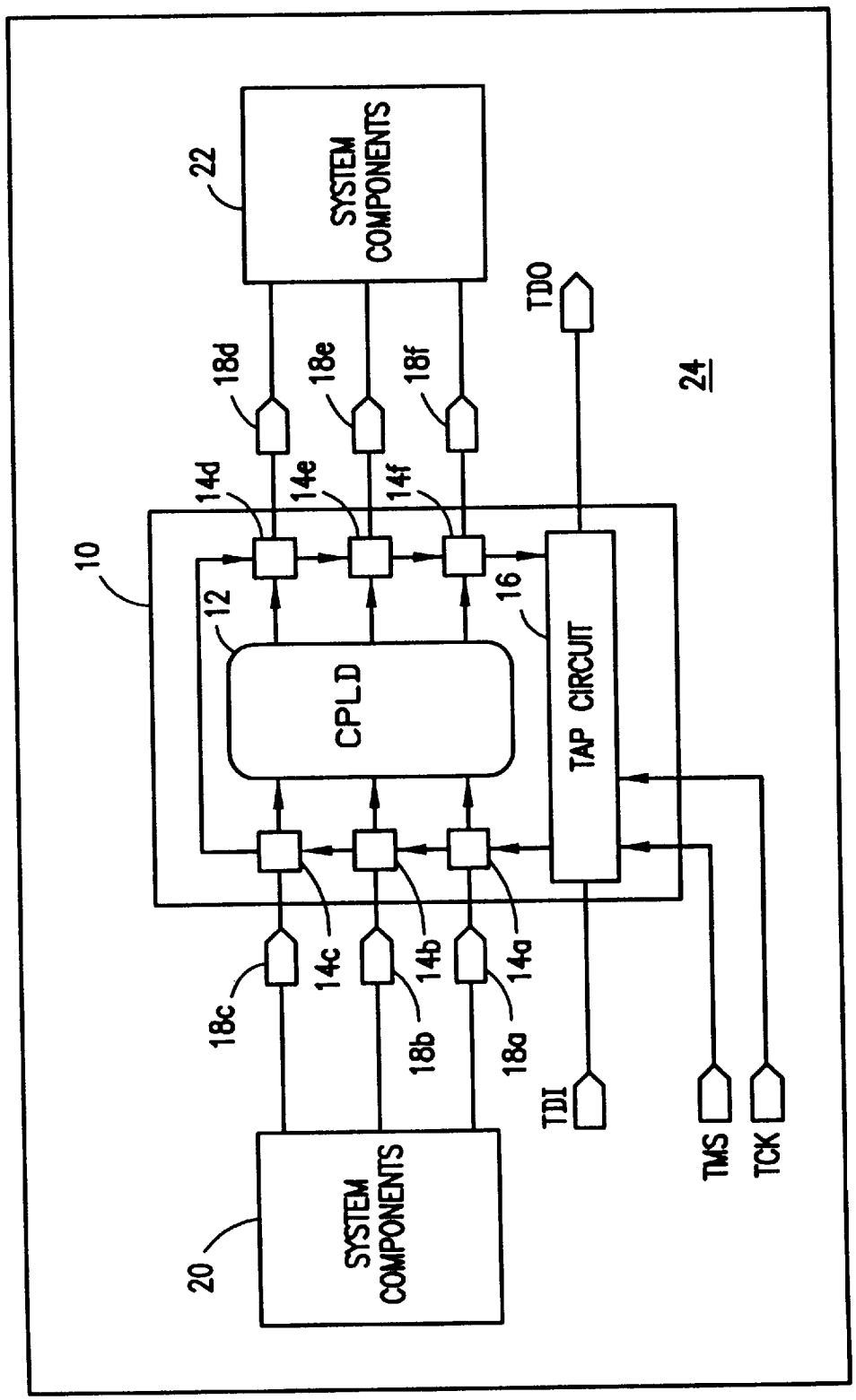
FIG. 1 is a schematic overview of an integrated circuit package which includes a CPLD, boundary-scan registers, and TAP circuit block of the present invention.

Referring now in detail to the drawings, there is shown schematically in FIG. 1 an integrated circuit package 10 which is comprised of a complex programmable logic device (CPLD) 12, a plurality of boundary-scan registers 14a–14f, and a TAP circuit block 16 of the present invention. For convenience of illustration, the integrated circuit package 10 is depicted with input/output (I/O) pins 18a–18f in which pins 18a–18c are input pins and pins 18d–18f are output pins. As should be apparent to those skilled in the art, the I/O pins 18a through 18f are connectable to other system components, such as elements 20, 22 located on the same assembled printed circuit board 24.

The TAP circuit block 16 has a first input control terminal TMS (Test Mode Select), a second input control terminal TCK (Test Clock), a common serial data input terminal TDI, and a common serial data output terminal TDO. In response to control signals applied to the input terminals TMS and TCK, the TAP circuit block 16 allows new data to be loaded serially into the boundary scan registers 14a–14f via the data input terminal TDI. Further, the data in the register can be shifted serially out via the data output terminal TDO.

Figure 2:
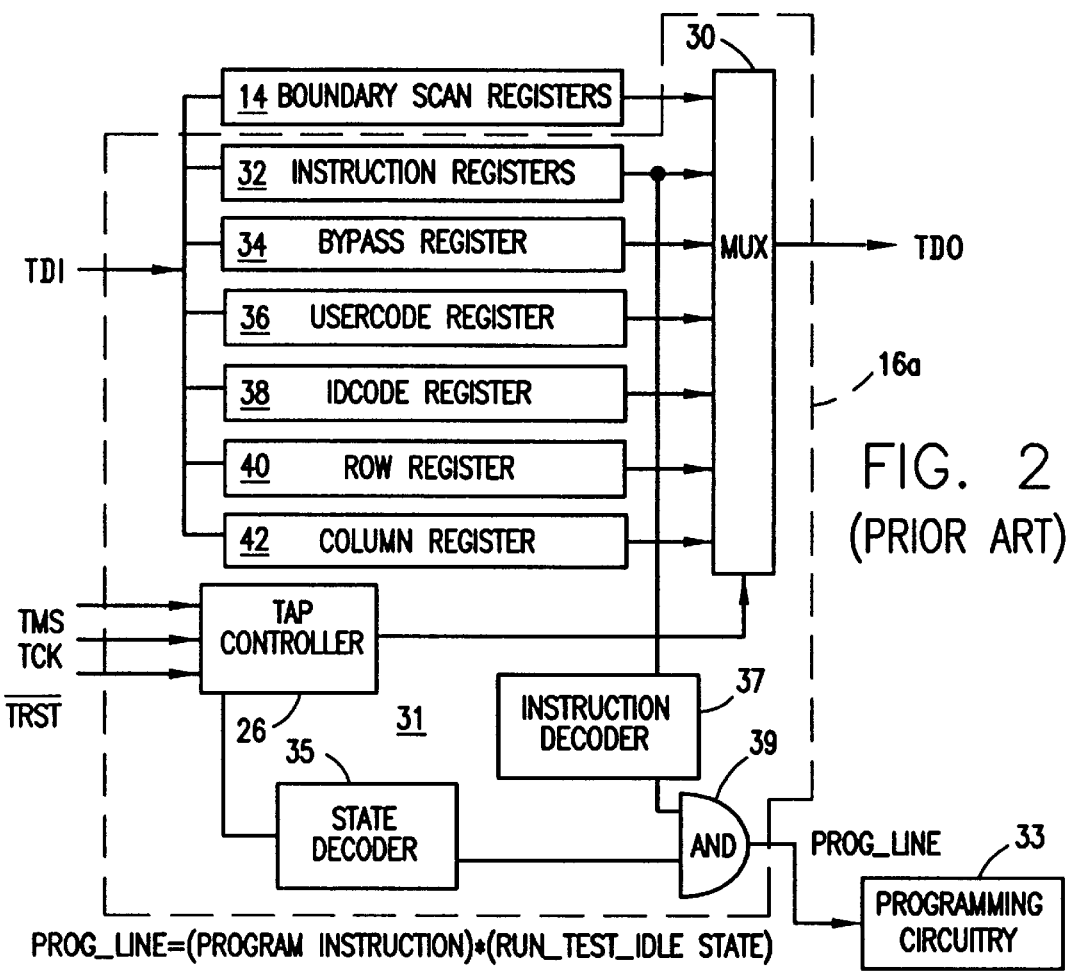
FIG. 2 is a detailed diagram of a prior art TAP circuit block with the associated boundary-scan registers for use in FIG. 1.

In FIG. 2, there is illustrated a more detailed block diagram of a prior art TAP circuit block 16a and the associated boundary scan registers 14. The TAP circuit block 16a includes a TAP controller 26, a plurality of JTAG test data registers 28, and a multiplexer 30. The plurality of JTAG registers includes an instruction register 32, a bypass register 34, a user code register 36, an ID code register 38, a row register 40, and a column register 42. All of the JTAG registers are connected in parallel between the data input terminal TDI and the data output terminal TDO via the multiplexer 30. Specifically, the input of each of the registers 32–42 are connected together and to the common serial data input terminal TDI. The output of each register 32–42 is connected to the input of the multiplexer 30, and the output of the multiplexer is connected to the common serial data output terminal TDO.

The TAP controller 26 receives the control signals on the input control terminals TMS and TCK and generates control signals on its output to the multiplexer 30 in order to select the appropriate one of the registers 14 and 32–42 for connection between the terminals TDI and TDO. As can best be seen from FIG. 1, the boundary scan registers 14a–14f for the I/O pins 18a–18f of the CPLD 12 are interconnected so as to form a shift-register chain around the border of the integrated circuit. As a result, there is provided a path with serial input and serial output connections.

The TAP circuit block 16a further includes logic circuitry 31 for generating a programming signal PROG_LINE which is fed to programming circuitry 33 for controlling duration of the programming operation. The logic circuitry 31 includes a state decoder 35 for detecting when the TAP controller 26 is in the RUN-TEST-IDLE state, an instruction decoder 37 for detecting when program instructions have been loaded into the instruction register 32, and an AND gate 39.

When the TAP controller 26 is in the RUN-TEST-IDLE state and the program instructions have been loaded into the instruction register 32, the output of the AND gate 39 defining the programming signal PROG_LINE will cause the programming circuitry 33 to be activated. The programming operation will be completed either when TAP controller 26 moves to another state or when another instruction is loaded into the instruction register 32.

Figure 3:
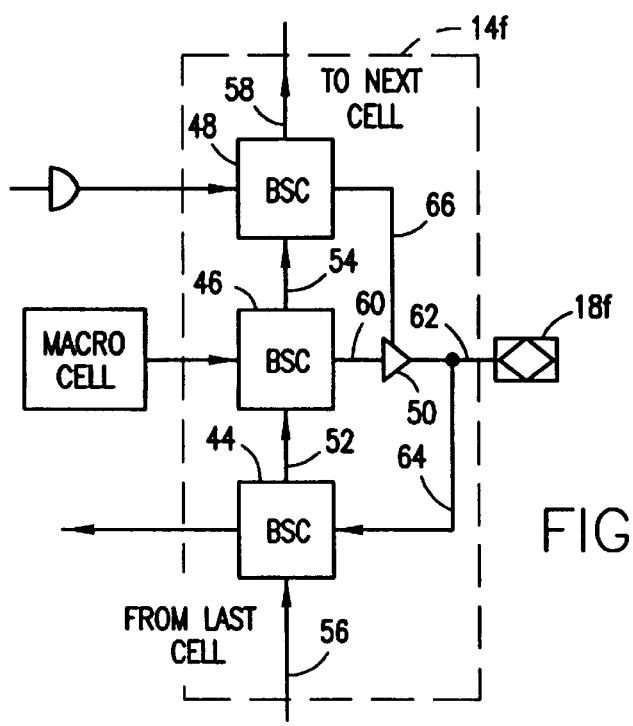
FIG. 3 is a schematic diagram of one implementation of one of the boundary scan register configuration of FIG. 1 for controlling an I/O pin.

One implementation of the boundary scan registers 14 such as 14f is shown in FIG. 3. In this illustration, the register 14f is formed of a first boundary-scan cell 44, a second boundary-scan cell 46, a third boundary-scan cell 48, and a buffer 50. The second boundary-scan cell 46 has a first input connected to the output of the boundary-scan cell 44 via line 52 and has a first output connected to the input of the boundary-scan cell 48 via line 54. The boundary-scan cell 44 has a first input on line 56 defining the input of the boundary-scan register 14f, and the boundary-scan cell 48 has a first output on line 58 defining the output of the register 14f. The line 56 is connected to the output line of the previous boundary-scan register, and the line 58 is connected to the input of the next boundary-scan register. Thus, in this case there would be six boundary-scan registers (14a–14f) connected together in a daisy chain such that the input line 56 of the first boundary-scan register (14a) is connected to the serial data input terminal TDI and the output line 58 of the last boundary-scan register (14f) is connected to the serial output data terminal TDO.

Further, it can be seen that the second boundary-scan cell 46 has a second output connected to the input of the buffer 50 via line 60. The output of the buffer 50 is connected to the output pin 18f via line 62 and to a second input of the boundary-scan register 44 via line 64. The third boundary-scan cell 48 has a second output on line 66 connected to a control input of the buffer 50 for switching it ON and OFF. When the buffer 50 is turned ON the output of the second boundary-scan cell 46 will be sent to the output pin 18f. On the other hand, when the buffer 50 is turned OFF, the output pin 18f is tri-stated in test mode.

Referring back to FIG. 2, the operation of the prior art TAP circuit block 16a and the associated boundary-scan registers 14 will now be described during programming of the CPLD 12 of FIG. 1. It should be understood by those skilled in the art that programming of the CPLD 12 is performed on a row-by-row basis. Initially, programming address and data will be shifted into the JTAG row register 40 and column register 42 through the common serial input data terminal TDI. Next, appropriate instructions are shifted into the instruction register 32. The TAP controller 26 in response to input control signals applied to the input terminal TMS generates output control signals to determine whether the instruction register 34 or one of the other test data registers 14, 36–42 is to be loaded. After the instruction register 32 is loaded, then the TAP controller 26 will select the appropriate test data register dependent upon the instruction that was just loaded.

Figure 5:
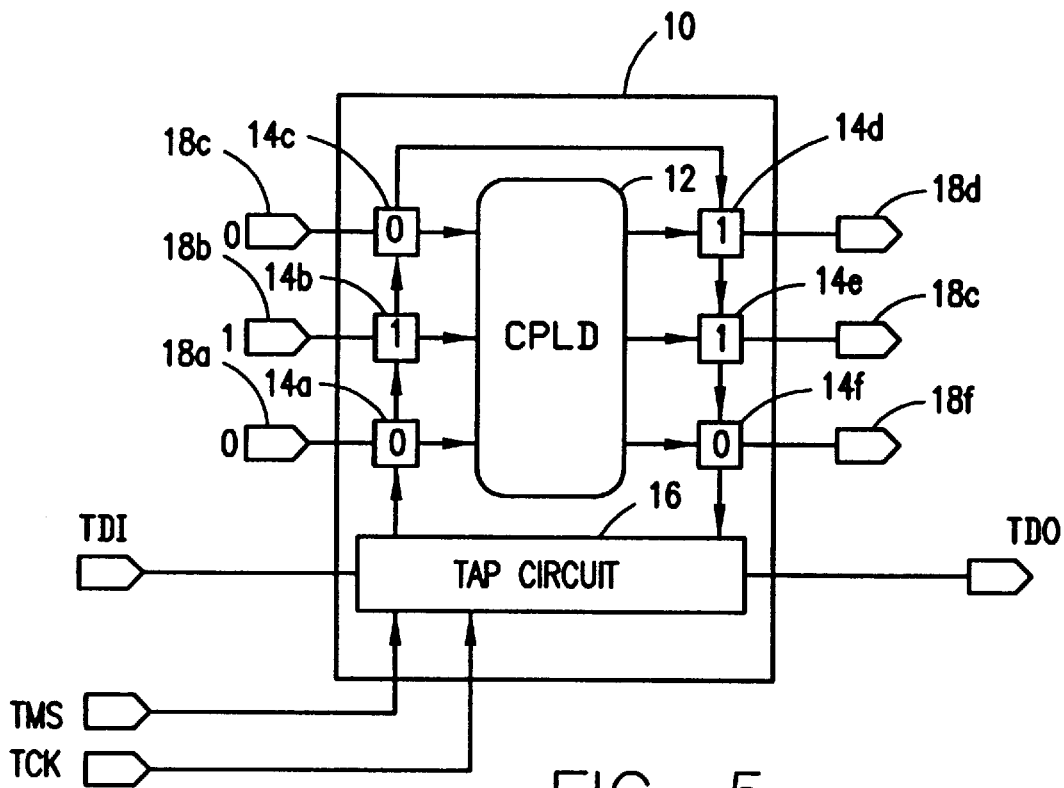
FIG. 5 shows an integrated circuit package similar to FIG. 1, illustrating the loading of the boundary-scan cells with data.
Figure 6:
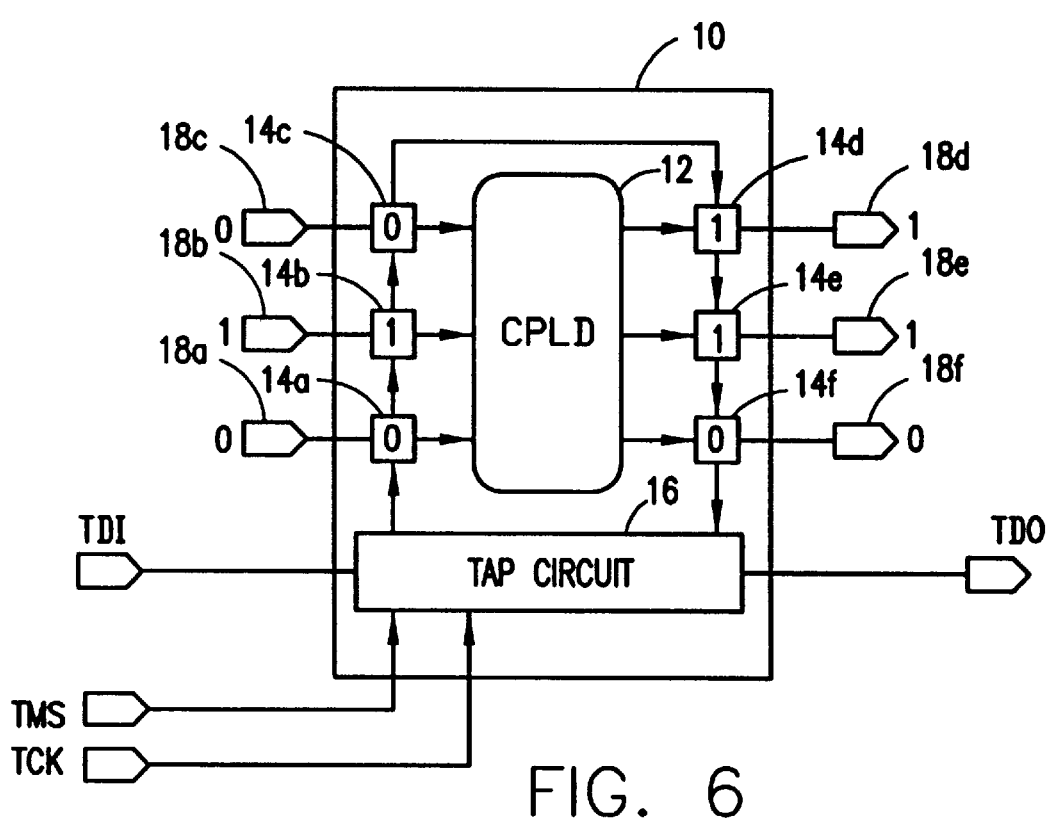
FIG. 6 shows an integrated circuit package similar to FIG. 1, illustrating the driving of the boundary scan data onto I/O pins.

Under specification governing programming, it is required that the I/O pins of the CPLD 12 be set to a known state (e.g., high, low, or tri-state) prior to the beginning of the programming mode of operation. As a result, different control signals can be generated on the I/O pins 18a–18f while the CPLD 12 is being reconfigured by interspersing the loading of data into the JTAG boundary-scan register 14 and the loading of programming data and/or instructions. In other words, the boundary scan registers 14a–14f can be loaded with corresponding data 010110 as illustrated in FIG. 5. Thereafter, these values are transferred onto the associated I/O pins 18a–18f by using the EXTEST JTAG instruction, as illustrated in FIG. 6. Then, one row of the CPLD 12 can be programmed by shifting in the programming address and data into the row and column registers 40, 42 and by shifting in programming instructions into the instruction register 32 via the common serial data input terminal TDI.

Prior to the start of programming of the next row of the CPLD 12, a new set of data (different values from 010110) can be loaded into the boundary scan cells. Then, this new set of data can again be transferred or forced onto the associated I/O pins 18a–18f. It should be noted that any number of rows, such as one or two, could be programmed before altering the I/O pins 18a–18f with a new set of data. However, since the TAP controller 26 must remain in a certain state for a predetermined amount of time such as 50 ms during the time of programming a row, the states of the I/O pins can only be altered with a new set of data after this predetermined amount of time has expired. Thus, the switching rate of the I/O pin is dependent upon the programming time. This creates an inefficient operation and results in a performance penalty.

The inventor of the present invention has developed a way to modify the TAP circuit block 16a of FIG. 2 so as to increase the rate at which a new set of data can be switched onto the I/O pins 18a–18f while the CLPD 12 is being reconfigured. This is achieved by adding control circuitry so as to render the programming on a row-by-row basis to occur as a self-timed operation. In other words, after programming data has been loaded and programming of a particular row of the CPLD 12 has commenced, the loading of a new set of data into the boundary scan registers 14a–14f and the subsequent driving of the new values onto the corresponding I/O pins 18a–18f can be performed. Consequently, the switching rate of a new set of data onto the I/O pins will not be limited by the programming time, but will be determined by the speed at which the data can be loaded into the boundary scan cells and then driving them out onto the I/O pins.

Figure 4:
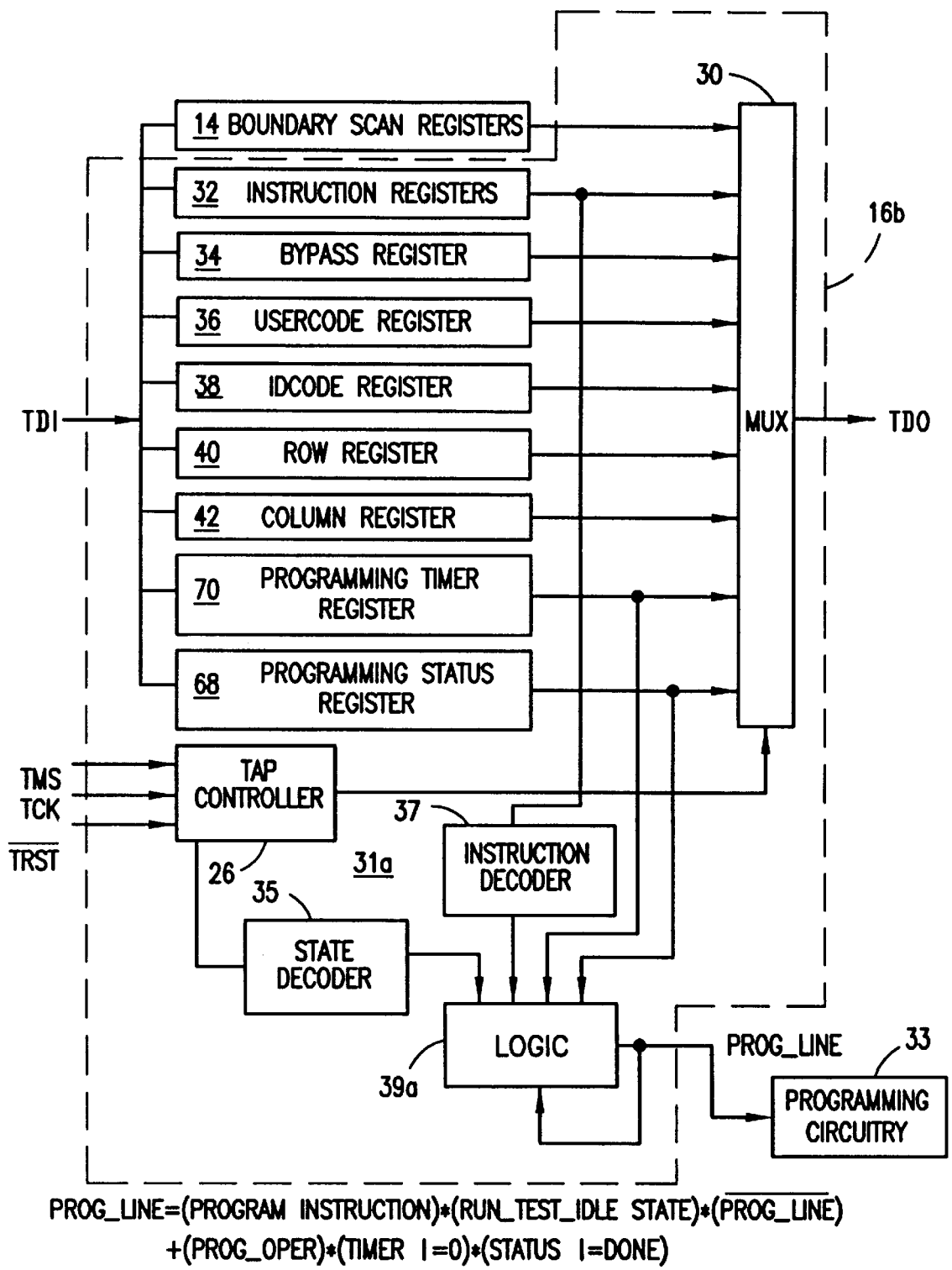
FIG. 4 is a detailed diagram of a TAP circuit block for use in FIG. 1, constructed in accordance with the principles of the present invention.

One implementation of the self-timed programming operation is shown in FIG. 4 which consists of a new and improved TAP circuit block 16b, constructed in accordance with the principles of the present invention. The TAP circuit block 16b is substantially identical to the block 16a of FIG. 2, except that added control circuitry consisting of a programming status register 68 and a programming timer register 70 have been included. The programming timer register 70 and the programming status register 68 are connected in parallel with the other registers 14, 32–42 between the common serial input data terminal TDI and the common serial output data terminal TDO. The timer register 70 is preferably made to be responsive to the control clock signal applied to the terminal TCK whose frequency is user-specified for controlling the duration of the programming operation.

The TAP circuit block 16b further includes logic circuitry 31a for generating a programming signal PROG_LINE which is fed to programming circuitry 33 for controlling of the programming operation. A logic circuitry 31a is substantially identical to the logic circuitry 31 in FIG. 2, except that the AND gate 39 has been replaced with a logic block 39a. Logic block 39a is now a function of the contents of the timer register 70 and the status register 8 as well as states of the TAP controller 26 and instruction register 32.

Initially, the programming signal PROG_LINE will be inactive. When the TAP controller 26 is in the RUN-TEST-IDLE state and the program instructions have been loaded into the instruction register 32, the programming signal will become activated. After the programming signal PROG_LINE has been activated to commence the programming operation, it will then be a function of the contents of the programming timer register 70 and the programming status register 68. In other words, the programming signal PROG_LINE will remain active if the time count in the timer register 70 is greater than 0 (assuming that it is counting down) and the DONE bit in the status register has not been set. In this manner, other JTAG operations can be performed once programming begins by allowing the TAP controller 26 to move to other states and allowing different instructions to be loaded into the JTAG instruction register 32.

In operation, prior to the start of programming of each row of the CPLD 12 the programming status register 68 is cleared or reset and the programming timer register 70 is loaded with the value 0000 so as to count up to a fixed value or with a count value so as to count down. Unlike the prior art, the amount of programming time is controlled by the timer register 70 and not by the TAP controller 26. However, the TAP controller 26 must maintain the CPLD 12 in the programming mode once it is started even though it can be switched to perform other JTAG operations. This programming mode can be retained by not transitioning to the test logic reset state of the TAP controller 26 through the control of the terminal TRST.

When the TAP controller 26 causes program instructions to be loaded into the instruction register 32, the control signal on the terminal TCK will cause the timer register 70 to start counting either up or down. The status register 68 may be periodically monitored to determine whether the programming has been completed or not. If programming has been completed, a flag will be issued to set the status register 68 and the programming operation for the row will be halted. At this point, the user can decide to immediately proceed with programming the next row or can continue switching of the boundary scan cells, or perform any other JTAG operations before resuming programming of the next row.

Upon resumption of the programming mode, the next row of programming data will be loaded and the programming operation will be resumed. After the programming has started again, the additional new values can be loaded and driven onto the I/O pins. Of course, if it is determined that programming is still being performed, then the TAP controller 26 can perform other JTAG operations by replacing the programming data instruction with other JTAG instructions. For example, the loading and driving of additional new values onto the I/O pins 18a–18f.

In a second embodiment, the timer register 70 will be controlled by a separate external clock frequency signal which is applied via another external pin. In this manner, the programming timer register and the JTAG circuitry can be operated at different clock frequencies. As a result, the timer register 70 will not be interrupted if the control clock signal applied to the TAP controller 26 is suspended when performing other JTAG operations.

From the foregoing detailed description, it can thus be seen that the present invention provides a programmable logic device operable to generate different control signals during a time interval when it is being reconfigured. Control circuitry has been added so as to control the state of the input/output pins of the programmable logic device during programming. The control circuitry includes a programming timer register, a programming status register and logic circuitry to control existing programming circuitry in response to the state of the programming timer register and the programming status register.

While there has been illustrated and described what are at present considered to be preferred embodiments of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiments disclosed as the best modes contemplated for carrying out the invention, but that the invention will include all embodiments falling within the scope of the appended claims.

I claim:

1. A programmable logic device operable to generate different control signals during a time interval when it is being reconfigured in order to increase the rate at which data can be changed on I/O Dins, said programmable logic device comprising:

a plurality of I/O pins (18a–18f);

boundary scan circuit means (14) operatively connected to said I/O pins for loading a new set of data and for driving said new set of data onto said I/O pins;

means for programming (33) said programmable logic device on a row-by-row basis when loaded with program instructions;

timer means (70) for counting a predetermined amount of programming time and being started in response to the loading of the program instructions into said programming means;

said timer means being formed of a programming timer register (70) which either counts down to zero or counts up to a predetermined value when said program instructions are loaded;

indicator means (68) being set prior to the loading of said program instructions into said programming means for generating a status signal when said timer means has completed counting said predetermined amount of programming time;

said indicator means being formed of a programming status resister (68) which is set before programming of each row;

logic circuit means (39a) being responsive to said status signal and said programming time for causing said programming means to halt the programming of a particular row;

said boundary scan circuit means capable of being loaded with additional sets of data to generate the different control signals during the time interval between the start of programming of the particular row and before the loading of programming data for the next row; and the loading of said boundary scan circuit means with said additional sets of data being temporarily suspended until the program instructions, programming data and programming time have been loaded and said programming means has been started.

2. A programmable logic device as claimed in claim 1, wherein said timer register is controlled by a user-specified frequency signal for controlling the duration of the programming operation.

3. A programmable logic device as claimed in claim 1, wherein said timer register is controlled by an external frequency signal which is different from a user-specified frequency signal for controlling the duration of the programming operation.

4. A programmable logic device as claimed in claim 1, wherein said boundary scan circuit means is comprised of boundary scan registers (14a–14f).

5. A programmable logic device as claimed in claim 4, wherein said boundary scan registers are formed of a plurality of boundary-scan cells (44–48).

6. A programmable logic device as claimed in claim 1, wherein said timer means is controlled by another separate external pin.

7. A method of operating a programmable logic device to generate different control signals during a time interval when it is being reconfigured in order to increase the rate at which data can be changed on I/O pins, said method comprising the steps of:

loading a new set of data in boundary scan circuitry operatively connected to I/O pins;

driving the new set of data onto the I/O pins;

programming the programmable logic device on a row-by-row basis when loaded with program instructions;

counting for a predetermined amount of programming time which is started after the program instructions are loaded;

generating a status signal after counting for the predetermined amount of programming time has been completed;

halting the programminga of a particular row in response to the status signal and the programming time;

loading the boundary scan circuitry with additional sets of data to generate the different control signals during the time interval between the start of programming of the particular row and before the loading of programming data for the next row; and suspending temporarily the loading of the boundary scan circuitry with the additional sets of data until the program instructions, programming data and programming time have been loaded and the programming step has been started.

* * * * *

UNITED STATES PATENT AND TRADEMARK OFFICE
CERTIFICATE OF CORRECTION

PATENT NO. : 5,805,607
DATED : September 8, 1998
INVENTOR(S) : Arthur H. Khu

It is certified that error appears in the above-indentified patent and that said Letters Patent is hereby corrected as shown below:

Column 6, line 62, change "TRST" to -- $\overline{\textbf{TRST}}$ --

Column 7, line 55, change "Dins" TO -- pins --.

Signed and Sealed this

Twelfth Day of January, 1999

Attest:

Attesting Officer    *Acting Commissioner of Patents and Trademarks*